United States Patent
Borromeo et al.

(10) Patent No.: US 7,203,096 B2
(45) Date of Patent: Apr. 10, 2007

(54) METHOD AND APPARATUS FOR SENSING A STATE OF A MEMORY CELL

(75) Inventors: Carlo Borromeo, Dresden (DE); Giacomo Curatolo, Dresden (DE); Rico Srowik, Dresden (DE)

(73) Assignee: Infineon Technologies Flash GmbH & Co. KG, Dresden (DE)

( * ) Notice: Subject to any disclaimer, the term of this patent is extended or adjusted under 35 U.S.C. 154(b) by 91 days.

(21) Appl. No.: 11/172,367

(22) Filed: Jun. 30, 2005

(65) Prior Publication Data

US 2007/0002654 A1   Jan. 4, 2007

(51) Int. Cl.
*G11C 16/06* (2006.01)
*G11C 7/02* (2006.01)

(52) U.S. Cl. .................. 365/185.21; 365/208
(58) Field of Classification Search ............ 365/185.21
See application file for complete search history.

(56) References Cited

U.S. PATENT DOCUMENTS

| | | | |
|---|---|---|---|
| 5,013,943 A * | 5/1991 | Hirose ..................... 327/51 |
| 5,056,063 A * | 10/1991 | Santin et al. ........... 365/185.21 |
| 5,161,123 A | 11/1992 | Mochizuki | |
| 5,258,955 A * | 11/1993 | Gaultier ..................... 365/203 |
| 5,297,093 A * | 3/1994 | Coffman ..................... 365/208 |
| 5,388,078 A * | 2/1995 | Arakawa ..................... 365/203 |
| 5,559,455 A * | 9/1996 | McPartland ................. 327/53 |
| 5,617,354 A * | 4/1997 | Cha et al. ............... 365/185.21 |
| 5,929,658 A * | 7/1999 | Cheung et al. ............... 327/53 |
| 6,011,725 A | 1/2000 | Eitan | |
| 6,608,787 B1 * | 8/2003 | Daga et al. ................. 365/203 |
| 6,996,010 B2 * | 2/2006 | Briner ................... 365/185.21 |
| 2005/0041469 A1 | 2/2005 | Marotta et al. | |

* cited by examiner

*Primary Examiner*—Son L. Mai
(74) *Attorney, Agent, or Firm*—Slater & Matsil, L.L.P.

(57) ABSTRACT

A cell arrangement comprising a memory cell arranged in parallel to a first capacitor is charged to a first voltage potential. A second capacitor is charged to a second voltage potential, which is higher than the first voltage potential. The second capacitor is connected to the cell arrangement while the voltage over the cell arrangement comprising the first capacitor is kept constant. The resulting current from the second capacitor through the memory cell is used to detect the state of the memory cell.

20 Claims, 6 Drawing Sheets

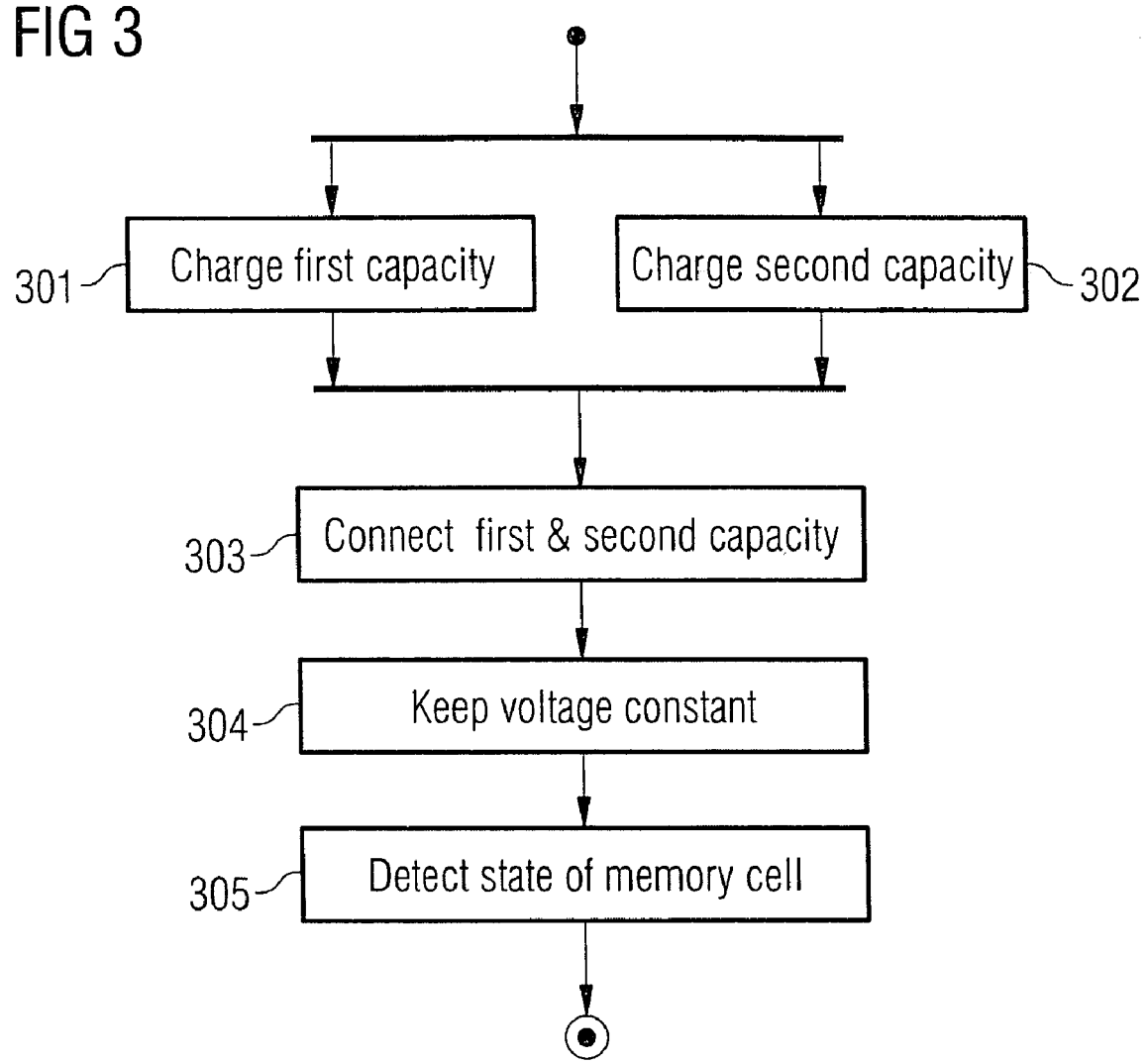

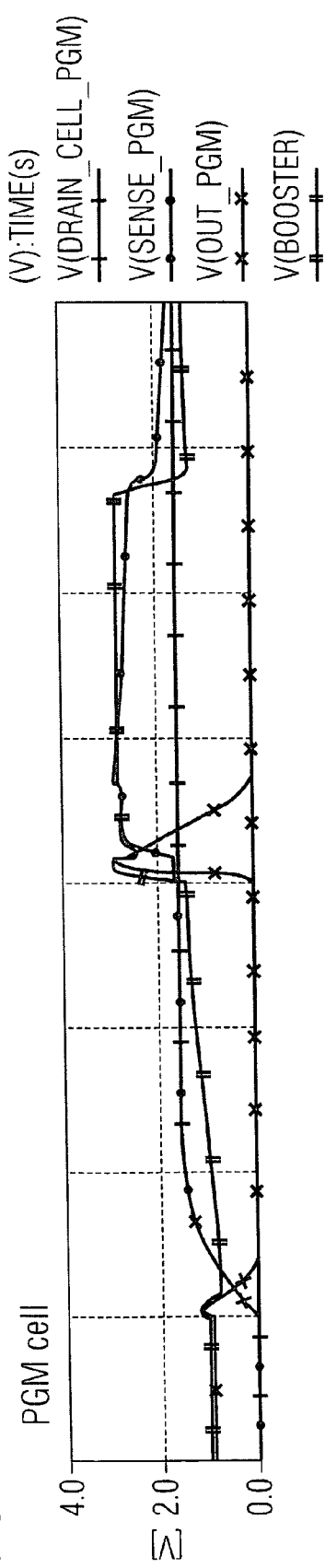
FIG 4C PGM cell
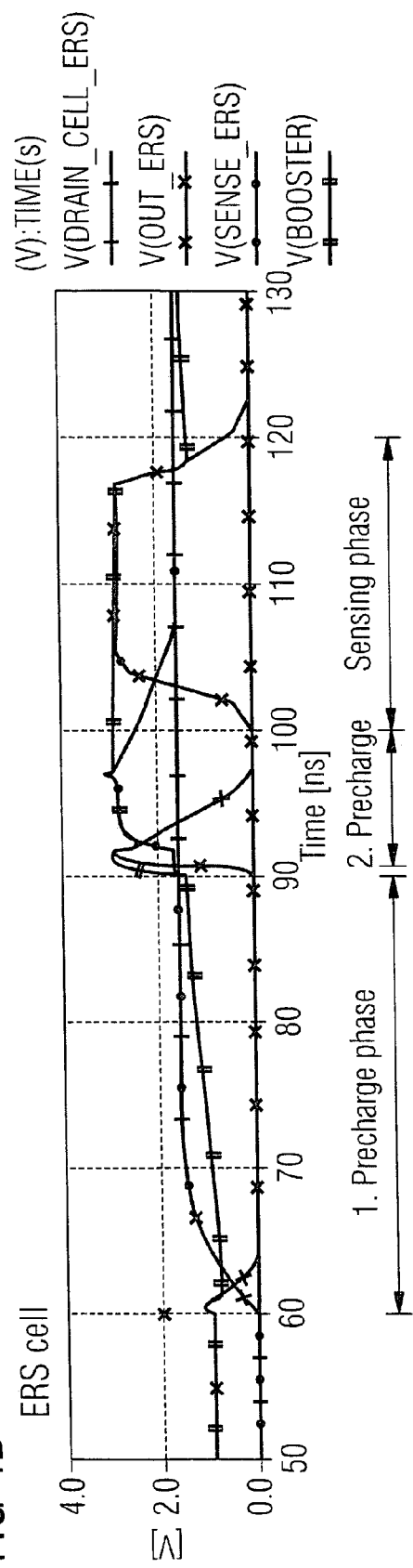
FIG 4D ERS cell

METHOD AND APPARATUS FOR SENSING A STATE OF A MEMORY CELL

TECHNICAL FIELD

The invention relates to semiconductor memory in general and to a sensing arrangement for sensing the state of an individual non-volatile memory cell in particular.

BACKGROUND

Types of Memory

There exist different types of non-volatile memory. Read-only memory (ROM) is programmed at the time of manufacturing. They are cheap to produce but the content of their cells cannot be changed. The memory cells of programmable ROMs (PROMs) can be programmed once, typically using a voltage higher than the operational voltage, but not be erased again. In an erasable PROM (EPROM), all cells can be erased together by exposing the memory cells to relatively strong UV radiation. The cells of electronically erasable PROMs (EEPROMs) and flash EEPROMs can be programmed and erased electronically. While in EEPROMs, every memory cell must be erased individually, in flash EEPROMs, all memory cells or large blocks of cells can be erased together (in a flash).

Despite their higher prices compared with RAM and ROM, EEPROMs are becoming more and more popular. They allow the replacement of code stored in a memory module of a device without the need to remove that memory module from the device. Unlike RAM, they also allow the ability to maintain the stored data in the absence of a supply voltage. In addition, they are also insensitive to mechanical stress and magnetic fields. For these reasons, memory cards based on EEPROMS have also become a popular storage media in mobile applications. Examples of such applications are personal media players or mobile phones.

Floating Gate Memory Cells

There are different types of EEPROM cells. Several types are based on floating gate MOSFETs (metal oxide semiconductor field effect transistors). Between a control gate and a source/drain channel, a conductive layer, the floating gate, is sandwiched between two insulating layers. Charge is brought onto the floating gate using hot electron injection or Fowler-Nordheim tunneling. A memory cell containing a significant amount of charge on its floating gate is referred to as programmed and represents a logical "1". As a consequence of the resulting electrical field, the substrate below the gate is depleted of charge carriers and the channel resistance increases for a constant control gate voltage. Inversely, floating gate MOSFETs, which contain no or only little charge on the floating gate, are called erased and have a higher conductivity representing a logical "0".

Variations of the floating gate memory cell exist, in which different amounts of charge are stored in the floating gate. The resulting different channel conductivity is used to encode two or more bits of information. For example, a memory cell providing four different states of charge or channel conductivity can be used to store two bits of information.

NROM Memory Cells

Another type of memory cell is based on nitride ROMs (NROMs). NROM cells comprise a dielectric, non-conductive layer between the control gate and the source/drain channel of the substrate. Typically, a nitride layer is sandwiched between two oxide layers, with the resulting memory device called an ONO EEPROM.

Unlike in the case of a conductive floating gate, charge trapped in the dielectric layer of an NROM memory cell remains fixed in this layer. Consequently, charge can be stored in different locations of the dielectric layer, e.g., close to a source or drain terminal of a MOSFET.

As with a conductive floating gate transistor, the amount of charge trapped and thus the conductivity of the channel underneath it can be divided into several levels for an NROM memory cell, allowing several bits of information to be stored.

Alternatively, charge can be stored in different regions of the nitride layer, with each region acting as a different storage cell. From the U.S. Pat. No. 6,011,725, which is incorporated herein by reference, it is known to store a first bit near a first terminal of the NROM cell, for example the source, and to store a second bit near the second terminal of the cell, for example the drain. As is known in the art, the first bit can be read by measuring a forward current through the NROM cell, and the second bit can be read by measuring a backward current through the NROM cell.

Storing two bits of information in different regions of the nitride layer has the advantage that the difference between the individual states can be detected easier than in a multi-level memory cell. However, the state of the second bit influences the current flowing through the cell when detecting the state of the first bit and vice-versa. This is also referred to as the second bit effect. Though the second bit effect is small in comparison with the effect caused by the state of the bit to be read, it can become more important as the operational voltage of the memory cell becomes lower.

Low Voltage Circuits and Sensing Amplifiers

In order to save power and to allow smaller die structures to be used for a semiconductor circuit, the operational voltages of memory modules are getting lower and lower. Whereas 5 V and 3.3 V were previously used as supply voltages, new devices use voltages of 1.6 V for example.

Sensing arrangements known in the art usually sense a threshold control gate voltage, at which a fixed reference current flows through a memory cell to be sensed. Voltage drops occurring at the various lines of an integrated circuit arrangement reduce the signal strength to be detected. Most importantly supply and bit lines connecting a memory cell with a sense amplifier and other periphery devices have an associated resistance over which a voltage drops. Consequently, the voltage observed by the sensing arrangement is not equal to the local voltage of the memory cell. The higher the current flowing through the cell, the higher is the voltage drop over the bit line.

The bit line connecting the memory cell with a sense amplifier also has an associated capacitance. Consequently, signal changes of the sense amplifier to a predefined voltage level do not occur instantaneously at the memory cell and vice-versa. Instead, the voltage of the bit line increases over time, like the voltage of a charging capacitor. This might cost valuable energy of a high voltage source being used to charge the bit line before or during sensing. In order to enable high operation speed of the memory device, a high current must be provided to charge or discharge the bit line. If the bit line is discharged over the memory cell for sensing, the relatively small current flowing through a memory cell can result in a lengthy sensing phase, which limits the overall performance of the memory device.

The adverse properties of the bit line contribute even more to differential sense amplifiers, i.e., sense amplifiers that compare a signal obtained from the memory cell to be sensed with a signal obtained from a reference cell in a known state. In such an arrangement, a second bit line must be provided between the sense amplifier and the reference cell, which causes further voltage drops or capacitance to the sense network.

SUMMARY OF THE INVENTION

According to preferred aspects of the invention, a cell arrangement comprising a memory cell and first capacitor connected in parallel with it, given for example by the bit line capacitance, is charged to a first voltage potential. The pre-charging of the cell arrangement can be performed quickly and directly using the supply voltage of a memory device.

A second capacitor, which is preferably much smaller than the first capacitor is charged to a second voltage potential, being higher than the first voltage potential. The second voltage can be provided by a voltage pump for example.

During the actual sensing phase, the cell arrangement is connected to the second capacitor, while the voltage of the cell arrangement is kept constant. For example, a transistor in source follower configuration can be used to maintain the voltage of the cell arrangement and thus of the first capacitor constant.

The current flowing through the memory cell, which is dependent on the programmed state of the cell, must be provided by the second smaller capacitor. Consequently, the voltage of the second capacitor will decrease relatively quickly from the second voltage potential and approach the first voltage potential if a significant current flows through the memory cell, i.e., if the memory cell is erased. If the memory cell is programmed, a much smaller current flows though the cell for the same gate voltage. For example, a current of 5 µA will flow through a programmed cell at a gate voltage of 5 V, whereas a current of 20 µA will flow through an erased cell using the same gate voltage. The decrease in the voltage level of the second capacitor is independent of the first capacitor, i.e., the bit line capacitor, and can be used to quickly detect the state of the memory cell.

The method and circuit arrangement according to embodiments of the invention outlined above has a number of advantages compared to sense amplifiers previously used.

First, the memory cell and its associated bit line capacitance can be precharged using the supply voltage directly, even if the supply voltage of the memory device is relatively low. This helps to save power, as no booster source is required in this phase.

Second, no source follower circuit is required in the precharge phase, which shortens this phase significantly. A transistor used to connect the cell arrangement to the supply voltage is used as an electronic switch, such that the first capacitor can be charged in a very short time. In addition, no signal magnitude is lost due to voltage drops occurring at a source follower transistor as in conventional sense amplifiers.

Third, the second capacitor used for the sense amplifier can be designed to be very small compared to the bit line capacitance. Thus, even if the second capacitor is precharged using a voltage pump or booster, very little energy is needed and the precharge phase can be kept very short.

Fourth, the actual sensing phase is very short due to the small size of the second capacitor being discharged over the memory cell. This process is independent of the bit line capacitance. If instead the relatively large bit line capacitance would be discharged through, or over, the memory cell, the sensing phase would be significantly longer.

Fifth, the sensing scheme according to preferred embodiments of the invention is directly sensing a state of a memory cell rather than performing a differential sense like many other sense amplifiers. This prevents an additional voltage drop occurring at the bit line driver for the reference cell. In addition, a single reference cell can be used to provide a trigger point for all sense amplifiers of a memory device instead of one reference cell per sense amplifier.

Sixth, the circuit arrangement used for the sense amplifiers is simpler than many earlier designs. Consequently, it takes very little space on an integrated circuit and allows a high degree of parallel sensing using many similar sense amplifiers.

DESCRIPTION OF THE DRAWINGS

For a more complete understanding of the present invention, and the advantages thereof, reference is now made to the following descriptions taken in conjunction with the accompanying drawing, in which:

FIG. 1, consisting of FIGS. 1A and 1B, shows an array of non-volatile memory cells according to the prior art, wherein

FIG. 3 shows a flow chart of a method for sensing the state of a memory cell in accordance with the present invention.

DETAILED DESCRIPTION OF ILLUSTRATIVE EMBODIMENTS

An Array of Memory Cells

Figure 1A:
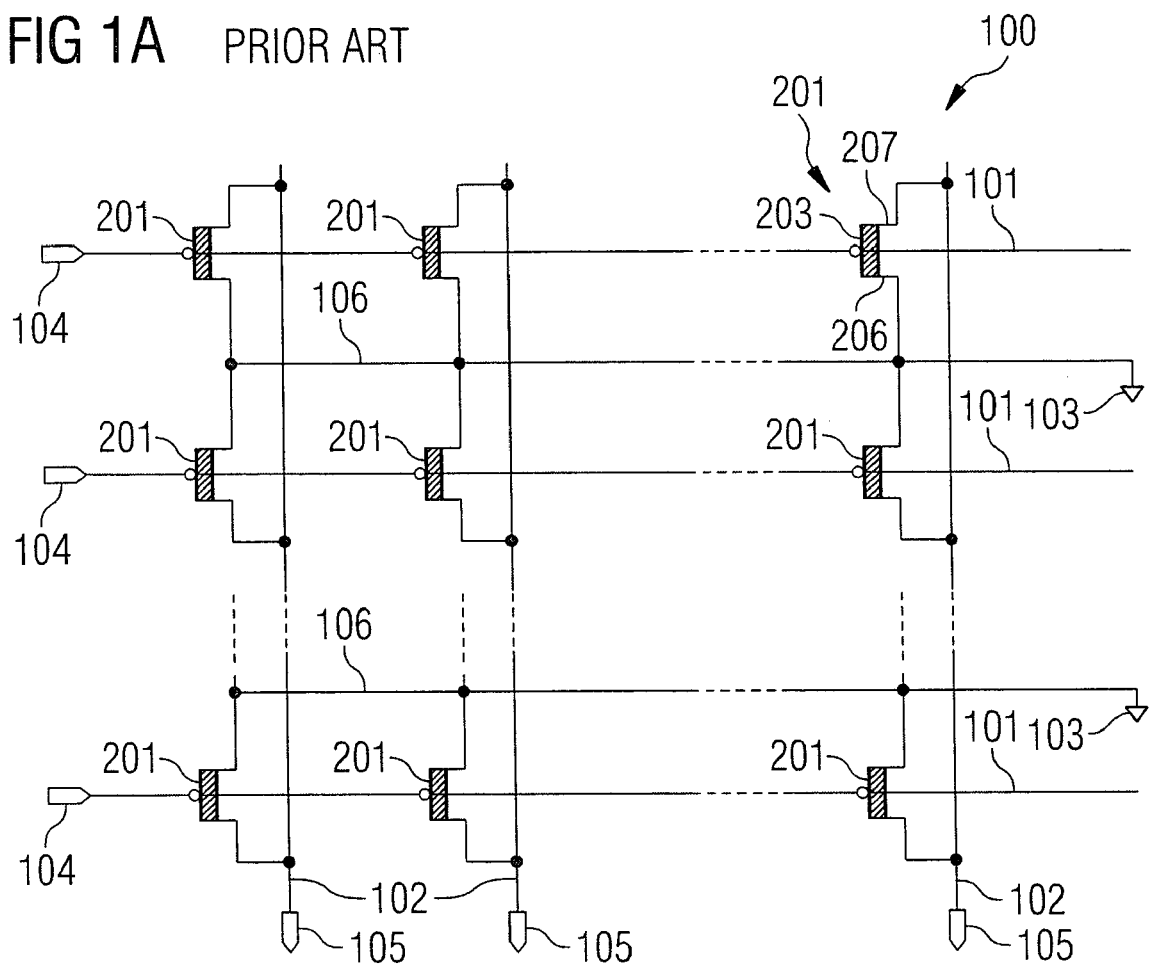
FIG. 1A shows an array of NROM cells and FIG. 1B shows an array of floating gate memory cells.

FIG. 1A shows an array 100 of NROM memory cells 201. The array 100 presented comprises three rows of memory cells 201, each row comprising three memory cells 201. In practice, the array 100 can contain many more memory cells 201, as indicated by the dots in FIG. 1A. In practice usually a power of two is used as the number of columns and/or rows. For example, an array 100 might comprise 4096 rows and 1024 columns. In addition, many arrays might contain extra rows and/or columns, providing extra capacity for defective memory cells 201, or space for management data, e.g., error correction codes.

All memory cells 201 of a row are connected to a common word line 101 with an input connector 104. The control signals provided to the input connectors 104 can be generated, for example by a row decoder (not shown) of the memory device. The word line 101 is connected to all control gates 203 of all memory cells 201 of a row. Also, all second terminal connectors 207 of all memory cells 201 of a common column of the array 100 are connected to a common bit line 102. The bit line 102 is connected to an output connector 105, which is connected, for example, to a sensing amplifier (not shown in FIG. 1A). Finally, all first terminal connectors 206 of all memory cells 201 are connected to a common voltage potential 103, for example electrical ground. In the embodiment of FIG. 1A, one common line 106 connects every two rows of memory cells 201 to the voltage potential 103. However, in practice the length of the lines 106 will be kept to a minimum in order to minimize voltage drops and capacitance of the lines 106.

Figure 1B:
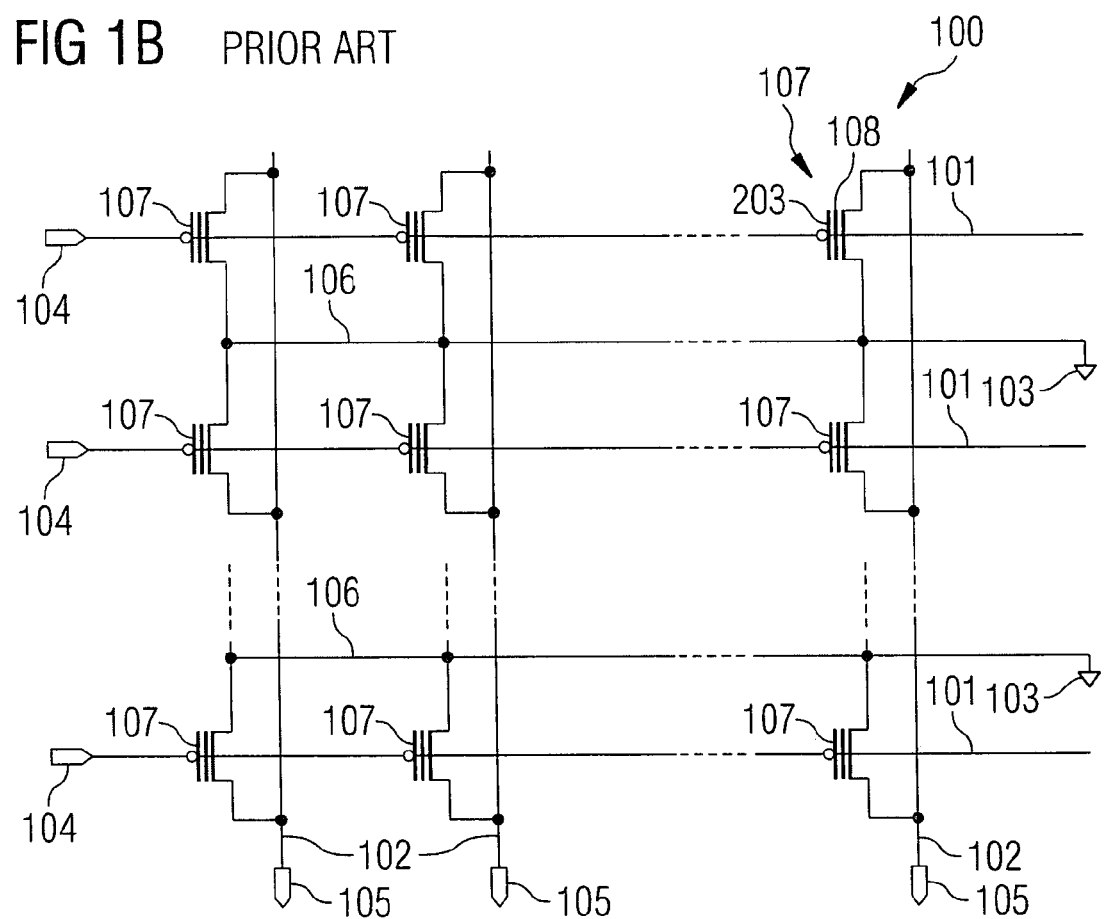

FIG. 1B shows a similar array of memory cells as FIG. 1A. It differs only in the type of memory cells being used. In FIG. 1B floating gate memory cells 107 are used as memory cells. The floating gate memory cells 107 comprise an additional conductive layer 108, the floating gate, between the control gate 203 and the substrate (not shown) of the memory cell 107. The floating gate 108 is used to store an electrical charge representing the state of the memory cell.

The configuration shown in FIGS. 1A and 1B is referred to as a NOR array, where each memory cell 201 can be selected individually by activating the corresponding word line 101 and sensing the state of the memory cell 201 using the corresponding bit line 102. Other configurations of arrays 100 of memory cells 201 are possible and used in practice. For example, it is common to connect a group of memory cells 201 of a row in series, also referred to as a NAND array. In order to read an individual memory cell 201 of a NAND array, a sufficiently high voltage is provided by the word lines 101 to the control gate 203 of all memory cells 201 of the relevant group with exception of the memory cell 201 to be sensed over the bit line 102. Such variations in set-up are known to a person skilled in the art and their particulars are independent from the sensing method and arrangement according to embodiments of the present invention. For these reasons, such variations will not be discussed in the further description of the current invention.

A Sense Amplifier According to the Invention

Figure 2:
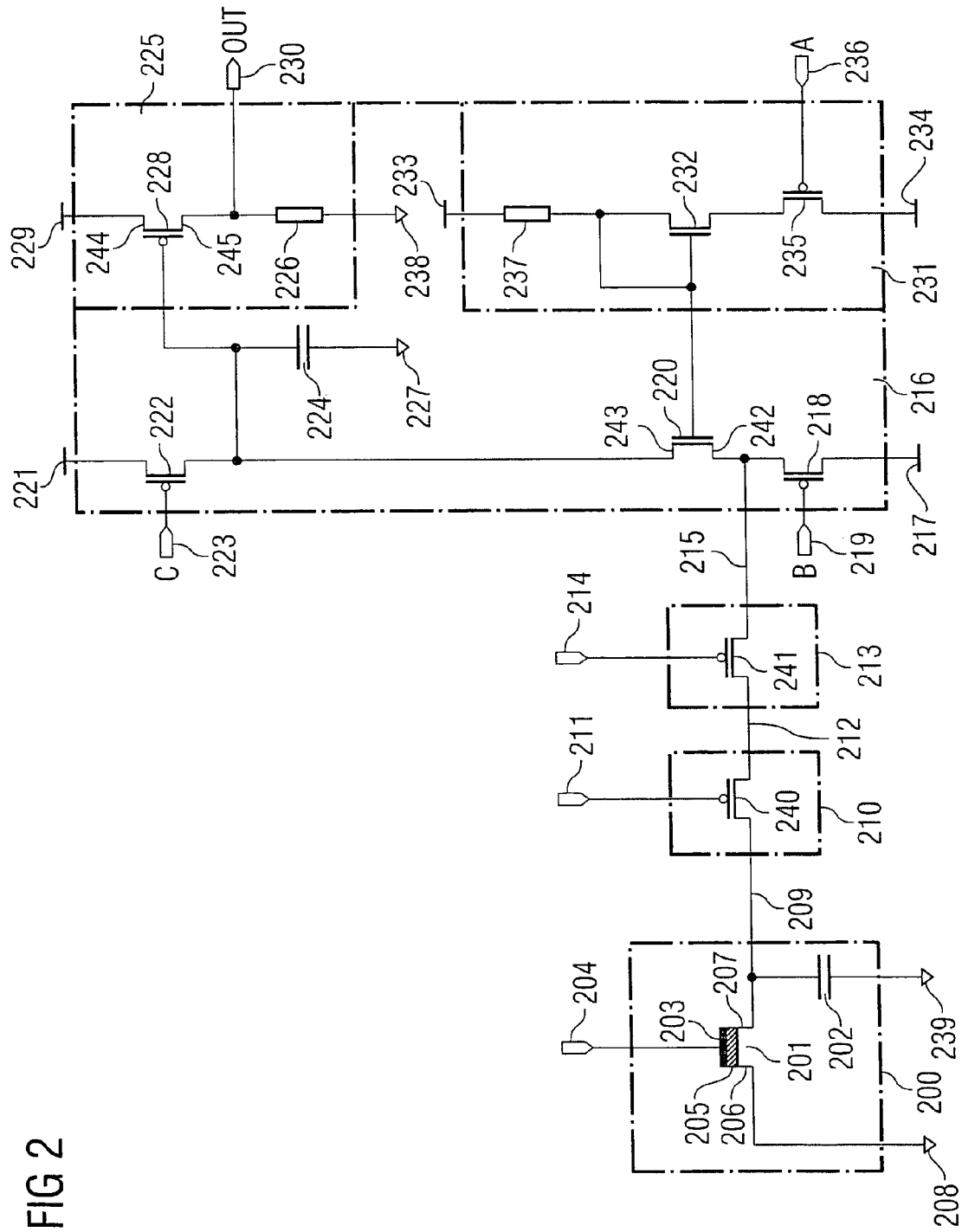
FIG. 2 shows a schematic circuit arrangement used for sensing the state of a memory cell.

FIG. 2 shows a schematic circuit arrangement used for sensing the state of a non-volatile memory cell 201. A cell arrangement 200 comprises a memory cell 201 and a first capacitor 202. A control gate 203 of the memory cell 201 is connected to an input node 204. Between the control gate 203 and the substrate (not shown) of the memory cell 201 there is a dielectric layer 205, in which a charge can be stored. The charge stored in the dielectric layer 205 represents the state of the memory cell 201. In the described embodiment the dielectric layer is a nitride layer, sandwiched between two oxide layers, also called an ONO memory cell.

The memory cell 201 further comprises two terminals 206 and 207. The first terminal 206 is connected to an electrical potential 208, for example the ground potential. The second terminal 207 is connected to a local bit line 209 (LBL), which connects the cell arrangement 201 with the input of a first selection means 210. The local bit line 209 is coupled to the ground potential 239 by the first capacitor 202.

In the embodiment shown, the first selection means 210 is implemented by a field effect transistor (FET) 240, for example a p-type MOSFET. The first selection means 210 is activated by means of a control signal received from a control input 211. In the example the control input 211 is connected to the control gate of the MOSFET 240, to switch on a connection between the input and the output of the first selection means 210, thus connecting the local bit line 209 with a global bit line 212 (GBL).

The output of the first selection means 210 is connected to the input of a second selection means 213 by means of the global bit line 212. The second selection means 213 is controlled by a control input 214 and is used to selectively connect an input 215 of a sense amplifier 216 to the global bit line 212. In the exemplary embodiment, the second selection means 213 comprises a p-type MOSFET 241, whose control gate is connected to the control input 214.

The output of the second selection means 213 is connected to a sense input 215 of a sense amplifier 216. The sense input 215 of the sense amplifier 216 can be connected to a first voltage potential 217, for example a supply voltage $V_{CC}$, by means of an electronic switch 218. In the embodiment shown in FIG. 2 a p-type MOSFET is used. The electronic switch 218 is controlled by a control input 219 with a corresponding control signal, which will be referred to as control signal B in the following paragraphs.

The sense input 215 is further connected to a drain terminal 242 of a further n-type MOSFET 220, whose source terminal 243 is connected to a second voltage potential 221 by means of an electronic switch 222. In the embodiment of FIG. 2, the electronic switch 222 is another p-type MOSFET, which is controlled by means of a control signal C received from a control input 223. In the illustrated embodiment, the second voltage potential 221 is higher than said first voltage potential 217. For example the second voltage potential 221 could be connected to a pump or booster arrangement (not shown) of a non-volatile memory module. For example a second voltage of 3 V could be generated from a first supply voltage of 1.6 V.

The source terminal 243 of the transistor 220 is further connected to a second capacitor 224 and an inverter arrangement 225. The second capacitor 224 can be charged to the voltage potential 221 against another voltage potential 227, for example electrical ground, by closing the electrical switch 222. In other words, the second capacitor can be boosted above the voltage potential 227 by the amount of the voltage potential 221, using a boost or pump arrangement as is known in the art.

The voltage of the source terminal 243 and thus the capacitor 224 is used as an input signal to an inverter arrangement 225. In the illustrated embodiment, the inverter arrangement 225 comprises a p-type MOSFET 228, whose source terminal 244 is connected to a voltage potential 229, for example to the same voltage as the potential 221. Its drain terminal 245 is connected to an output node 230 called OUT, which is used to indicate the programmed state of the memory cell 201. The drain terminal 245 is further connected to a voltage potential 238 via a resistor 226. For example, the voltage potential 238 can be the same as the potential 227, i.e., electrical ground. The resistor 226 is used to limit the current through the transistor 228 to a fixed reference current and also acts as a voltage divider in combination with the transistor 228.

The control gate of the n-type MOSFET 220 is connected to a bias voltage, provided by a bias generator 231. In the embodiment of FIG. 2, the bias generator 231 comprises a n-type MOSFET 232, preferably of substantially identical properties as the n-type MOSFET 220. The input of the bias generator 231 is connected to the control gate of the transistor 232. The transistor 232 is configured in diode configuration, i.e., its control gate is connected to one of its terminals. The transistor 232 is connected in series with an electronic switch 235 and a current limiting means 237, here a resistor, between a voltage potential 233 and a voltage potential 234. The voltage potential 233 is higher than the voltage potential 234. In one example, the voltage potential 233 is substantially identical to the second voltage potential 221, e.g., a pump or booster voltage, and the voltage potential 234 is substantially identical to the first voltage potential 217, e.g., a supply voltage of a memory device. The electronic switch 235 is preferably another p-type MOSFET, which is controlled by a control signal A provided by a control input 236.

It should be noted here and will be clear to a person skilled in the art that, although the first capacitor 202 is drawn as a discrete capacitor in the cell arrangement 200, in reality the first capacitor 202 is given by the capacitance of the local and global bit line 209 and 212, the first and second selection means 210 and 213 and the input connection 215. That means that the first capacitor 202 is distributed over the entire length of the connection between the sense amplifier 216 and the cell arrangement 200. Consequently, the first capacitor 202 is intrinsic to any array 100 of memory cells 201 and cannot be avoided or easily reduced in practice. Equally, the second capacitor 224 can be provided by the capacitance of the sense amplifier 216 rather than by an extra, discrete capacitor. Unlike the first capacitor 202 the second capacitor 224 can be designed according to the requirements of the circuit arrangement.

In addition, although the embodiment of FIG. 2 shows a first and a second selections means 210 and 213, any number of selection means can be used to connect a sense amplifier 216 to a cell arrangement 200. For example, if one sense amplifier 216 is provided per column of an array 100 of memory cells 201, no selection means 210 or 213 needs to be provided. However, in order to keep the first capacitor 202 to a minimum, groups of memory cells 201 are usually connected to a global bit line 212 using a selection means 210. In addition, one sense amplifier 216 can typically be connected to different global bit lines 212 using an additional selection means 213.

A Method for Sensing the State of a Memory Cell

A method for sensing a state of a memory cell 201 in accordance with embodiments of the invention is described with reference to exemplary the circuit arrangement shown in FIG. 2 and the flow chart presented in FIG. 3.

Preparation Phase

Initially the electronic switches 235, 218 and 222 controlled by the control signals A, B, and C are opened and the two capacitances 202 and 224 are discharged.

In the exemplary embodiment of FIG. 2, at first the bias generator 231 will be activated in order to provide a bias voltage $V_{bias}$ to the control gate of the transistor 220. To this end a signal A is provided to the control input 236, which closes the electronic switch 235. For example, the control gate of the p-type MOSFET can be pulled down to an electrical ground potential. Consequently, a predefined current flows from the voltage potential 233 through the current limiting means 237, the transistor 232 and the electronic switch 235 to the voltage potential 234.

The memory cell 201 used in the exemplary embodiment is an enhancement mode n-type MOSFET, i.e., a channel between the first and second terminals 206 and 207 is depleted of charge carriers, even if no charge is trapped in the nitride layer 205 and no voltage is applied to the control gate 203. Consequently, during sensing, the control gate 203 is supplied with a threshold voltage $V_{th}$ high enough to allow a current to flow from the first to the second terminal 206 and 207 in case no charge carriers are trapped in the nitride layer 205, i.e., in case the memory cell 201 is in an erased state. For example, a threshold voltage $V_{th}$ of 5 V can be supplied. In an array 100 of memory cells 201 as depicted in FIG. 1A, the threshold voltage $V_{th}$ is supplied over the word line 101 of the corresponding memory cell 201.

First Precharge Phase

In a step 301 (FIG. 3), the first capacitor 202 is charged to the first voltage potential 217. A memory cell 201 is selected using control signals to the control inputs 211 and 214 and connected to the input connection 215 of the sense amplifier 216 using the first and second selection means 210 and 213. In addition, a suitable control signal B is used to close the electronic switch 218, for example by pulling the control input 223 to electrical ground. Unlike in sense amplifiers in accordance with the prior art, the transistor 218 is used as an electronic switch and not in a source follower configuration, allowing a relatively high current to flow through the global and local bit lines 212 and 209 to the cell arrangement 200.

Thus, the input connection 215, the global bit line 212, the local bit line 209, the capacitor 202 and the second terminal 207 of the memory cell 201 are very rapidly charged to the level of the first voltage potential 217.

During this phase, the second capacitor 224 is also charged to the first voltage potential 217, though the charge current for this path of the sense amplifier 216 is limited by the bias voltage $V_{bias}$. In the exemplary embodiment, the second capacitance 224 is very small. For example a capacitance of 50 to 100 fF can be used. As a consequence, even a very small current flowing through the transistor 220 will charge the second capacitor 224 relatively quickly. At the end of a predefined precharge time the electronic switch 218 is opened by providing a suitable signal B, e.g., by connecting the control input 219, with a voltage of 3 V.

Second Precharge Phase

In step 302 (FIG. 3), the second capacitor 224 will be charged to the second voltage potential 221. It is particularly advantageous that the second voltage potential 221 is significantly higher than the first voltage potential 217. For example, if the first voltage potential 217 is equal to a supply voltage $V_{CC}$ of 1.6 V, then a second voltage 221 in the range between 3V and 20 V can be used.

In order to precharge the second capacitor 224, a suitable control signal C is provided to the control input 223, which closes the electronic switch 222 and connects the second voltage potential 221 with the second capacitor 224. For example, the control input 223 can be pulled to electrical ground. At the same time a small current, limited by the bias voltage $V_{bias}$ of the transistor 220 flows from the second voltage potential 221 to the input connection 215.

This current will slowly charge the first capacitor 202, if the current flowing through the memory cell 201 is smaller than the current through the transistor 220. For example, if the memory cell 201 is in a programmed state with charge deposited in the nitride layer 205, the electrical field created between the nitride layer 205 and the substrate of the transistor 220 depletes charge carried from the channel between the first and second terminals 206 and 207. However, if the memory cell 201 is in a conductive state, i.e., if the memory cell 201 is not programmed or it is erased, the current flowing through the transistor 220 is too small to compensate for the charge loss from the first capacitor 202 through the memory cell 201 and thus the voltage of the first capacitor 202 will slowly decrease.

In either case the speed of charge or discharge of the first capacitor 202 will be very small compared with the precharge speed of the second capacitor 224, because the current through the memory cell 201 is limited by the transistor 220, which can be adjusted using the reference current of the bias generator 231. In contrast, the current used to load the second capacitor 224 is not limited by the electronic switch 222. In addition the second capacitor 224 is much smaller than the first capacitor 202 and can be charged much faster as a consequence. For example, the first capacitor 202 may have a capacitance of 1.3 to 2.6 pF, while the second capacitor 224 has a capacitance of 50 to 100 fF. As a consequence, the voltage of the bit lines 209 and 212, the input connector 215 and the first capacitor 202 will largely remain at the level of the first voltage potential 217 during the second precharge phase.

At the end of the second precharge phase the electronic switch 222 is opened by providing a suitable control signal C, e.g., by connecting the control input 223 with a potential of 3 V.

Sensing Phase

During the sensing phase the second capacitor 224 is discharged over the memory cell 201. The second capacitor 224 is connected to the cell arrangement 200 via transistor 220 in step 303. The transistor 220 is configured as a source follower and biased through $V_{bias}$ in such a way that the voltage of the input connection 215 is kept constant at the level of the first voltage potential 217 in step 304. More particularly, the bias voltage $V_{bias}$ provided to the control gate of the transistor 220 is equal to $V_{GS}+V_1$, with $V_{GS}$ being the voltage potential between the gate and the source terminal of the transistor 232 and $V_1$ being the voltage of the voltage potential 234, for example an operating voltage of 1.6 V. Consequently, the transistor 220 is operated in a saturation mode, with the conductivity of the path from the second capacitor 224 over the transistor 220 and the cell arrangement 200 being limited by the conductivity of the memory cell 201. Any charge lost through a current over the memory cell 201 is provided by the second capacitance 224 until the second capacitor is discharged to the voltage potential of the first capacitor 202 plus a threshold voltage $V_{th}$ of the transistor 220, i.e., the voltage level below which the transistor no longer operates in its saturation region but instead in its linear region.

As said above, the second capacitance 224 is very small in comparison with the first capacitance 202 and the current flowing though an erased memory cell 201. Consequently the second capacitor 224 will be discharged very rapidly in case of an erased memory cell 201 with its voltage dropping from the second voltage potential 221 to the first voltage potential 217.

As long as the voltage provided to the control gate of the transistor 228 is much higher than the first voltage potential 217, the source/drain connection of the transistor 228 will remain in the cut-off region, i.e., most of the voltage between the potentials 229 and 238 will drop at the transistor 228. Consequently, the OUT node 230 will remain at a low voltage level. However, once the voltage of the control gate of the transistor 228 drops below a predefined threshold voltage, its source/drain connection becomes conductive, i.e., its resistance will be much lower than that of resistor 226. Consequently, most of the voltage potential between 229 and 238 will drop at the resistor 226 and the output node 230 will provide a high voltage signal OUT.

Depending on the programmed state of the memory cell 201, this flipping of the output node 230 will occur at an earlier or a later time. Consequently, the point of time at which the node 230 flips can be used to determine whether the memory cell 201 is programmed or erased. This is performed in step 305. There are different methods to determine the time at which the OUT signal of the node 230 is measured.

One alternative is to use a fixed period of time as the sensing phase. For example, one could calculate the time it requires the current flowing through a programmed or an erased memory cell 201 to discharge the second capacitor 224 to the voltage level, where the transistor 228 is triggered. One could then choose a time between these two values, for example in the middle between these two times to measure the OUT signal of output node 230, for example using a timer circuit built into the memory device. However, it would be very hard to take account of variations occurring during the manufacturing process of the memory device.

Alternatively, one can provide a reference cell arrangement 200' and a reference sense amplifier 216', not illustrated herein, but similar in both set-up and configuration to those presented in FIG. 2. The reference cell 201' is programmed to a state between the programmed and the erased state, i.e., only a little charge would be trapped in its nitride layer 205'. Such a memory cell 201' would discharge the second reference capacitor 224' faster than a programmed memory cell 201, but slower than an erased cell 201. Consequently, one could use the signal change of the OUT node 230' of the reference sensing arrangement 216' to decide the point in time when to read out the OUT signal of the output node 230 of the sense amplifier 216.

It is advantageous that a reference cell 201' and all memory cells 201 of an array 100 manufactured in the same process will be subject to the same variations and equally affected by variations of it. It is a further advantage of the described procedure that a single reference cell 201' can be used to provide a trigger signal for all sense amplifiers 216 of an integrated circuit forming a memory device. It is common practice to use many sense amplifiers 216 in parallel in order to improve the read performance of a memory device. For example, one can use one sense amplifier 216 per bit line 102 or one sense amplifier 216 for every two bit lines 102.

At the end of the sensing phase, the output signal OUT is read from the output node 230 and transferred, for example, to a data output latch (not shown).

FIG. 4 shows the results of a simulation of a sense amplifier 216 operated in accordance with preferred embodiments of the invention. The figure shows a number of currents and voltages observed during the sensing of two different memory cells 201. The results obtained from a first memory cell 201, which is in an erased state, i.e., contains no charge on its nitride layer 205 or floating gate 108, are marked with the postfix "ERS". The results obtained from a second memory cell 201 that is in a programmed state, i.e., contains a predefined charge on its nitride layer 205 or floating gate 108, are marked with the postfix "PGM".

Figure 4A:
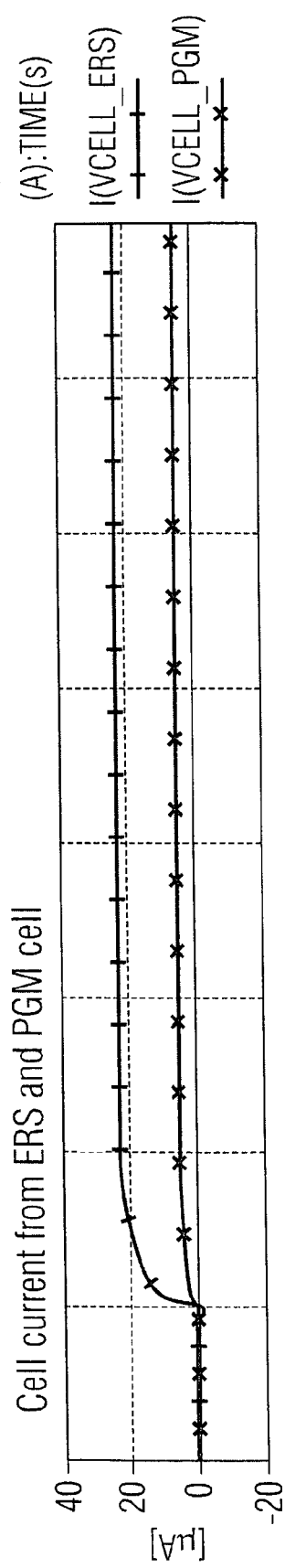
FIG. 4, consisting of FIGS. 4A–4D, shows a simulation of some currents and voltages occurring in a sense amplifier and cell arrangement according to the present invention.

FIG. 4A shows the cell current I(VCELL) flowing through the memory cell 201 of the cell arrangement 200. The current of the erased memory cell is significantly higher than that of the programmed cell.

Figure 4B:
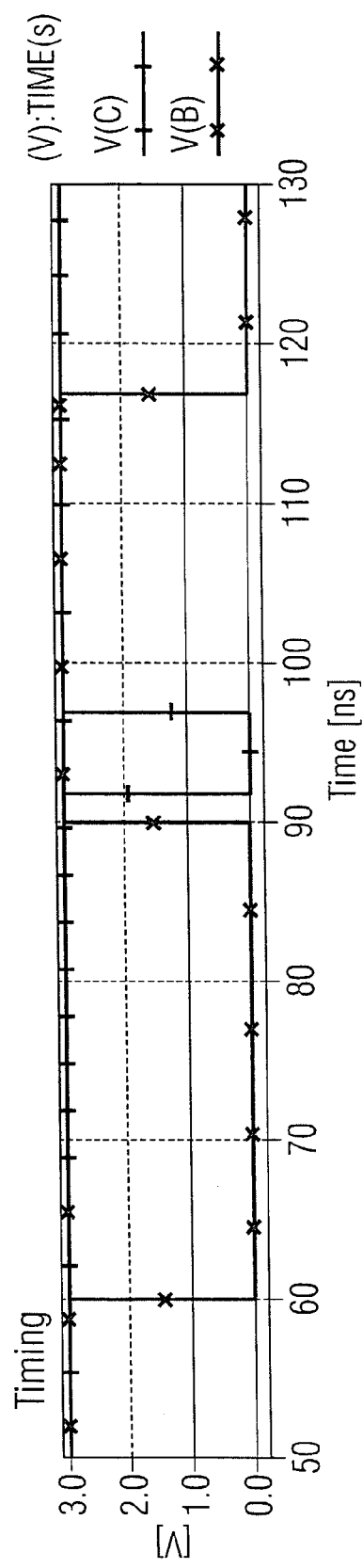

FIG. 4B shows the voltages provided as control signals B and C to the input nodes 219 and 223 respectively. During the first precharge phase, the signal B is pulled to electrical ground in order to activate the electronic switch 218. During the second precharge phase, the signal C is pulled to electrical ground in order to activate the electronic switch 222. At all other times they remain at a high voltage potential, with the switches 218 and 222 opened. One skilled in the art will recognize that different voltage levels may be required if switches 218 and 222 are different types of devices. For instance, if switch 218 or switch 222 was an n-type MOSFET, a high voltage level would be required to turn on the respective switch.

FIGS. 4C and 4D illustrate the voltage observed during the sensing of a programmed and an erased memory cell 201 respectively. During the first precharge phase, the voltage V(DRAIN_CELL) of the first capacitor 202 is charged to a first voltage potential 217. The voltage V(SENSE) of the second capacitor 224 follows the same curve. During the second precharge phase, the second capacitor 224 is charged to the second voltage potential 221, while the voltage of the first capacitor 202 remains mainly unchanged.

During the sensing phase of the programmed cell shown in FIG. 4C, the voltage V(OUT_PGM) of the output node 230 starts at a low voltage, because the second capacitor 224 is charged to the second voltage potential 221. Because the current I(VCELL_PGM) through the programmed cell is very small, the voltage of the second capacitor 224 only decreased very slowly, in such a way that the transistor 228 does not flip (i.e., change state) before the end of the sensing phase. The voltage V(OUT_PGM) of the output node 230, therefore, remains at its low potential throughout the sensing phase.

During the sensing phase of the erased cell shown in FIG. 4D, the voltage V(OUT_ERS) of the output node 230 also starts at a low voltage, because the second capacitor 224 is initially charged to the second voltage potential 221. Because the current I(VCELL_ERS) through the erased cell is comparatively large, the voltage of the second capacitor 224 decreased much quicker than that of the programmed cell. It approaches the first voltage potential 217 after approximately 10 ns, such that the transistor 228 flips at this time. The voltage V(OUT_ERS) of the output node 230 switches to a high voltage potential at this stage of the sensing phase.

While the above method has been described with reference to an exemplary NROM memory cell, the teachings apply equally to other memory cells such as a floating gate memory cell, and the like.

Although the present invention and its advantages have been described in detail, it should be understood that various changes, substitutions and alterations can be made herein without departing from the spirit and scope of the invention as defined by the appended claims. For example, other memory cell and cell arrangements are contemplated. Other bit line and selection schemes are also contemplated. Although an exemplary sense amplifier has been described in detail, it is contemplated that other sense amplifiers and equivalent circuits are within the scope of the invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for sensing a state of a memory cell, which is part of a cell arrangement comprising, said memory cell arranged in parallel to a first capacitor, the method comprising:
    charging said first capacitor to a first predefined voltage potential;
    charging a second capacitor to a second predefined voltage potential, said second voltage potential being higher than said first voltage potential;
    connecting said second capacitor to said cell arrangement while keeping the voltage over the first capacitor constant by controlling current flow from the second capacitor to the cell arrangement and through the memory cell; and
    detecting the state of the memory cell using said current flow as an indicator.

2. The method according to claim 1, wherein the current flow from the second capacitor to the cell arrangement causes the voltage across the second capacitor to decrease over time and wherein the rate of the voltage decrease is used in the step of detecting the state of the memory cell.

3. The method according to claim 1, wherein the voltage over the first capacitor is kept constant by means of a source follower comprising a load transistor arranged between said first and second capacitor.

4. The method according to claim 2, wherein said second capacitor is connected to a control input of an electronic switch and wherein said voltage decrease across the second capacitor triggers an output line of said electronic switch to switch from a third voltage potential to a fourth voltage potential, whereby the time it takes said electronic switch to switch said output line depends on the programmed state of said memory cell.

5. The method according to claim 2, wherein said voltage decrease across said second capacitor is compared with at least one reference voltage.

6. The method according to claim 5, wherein the reference voltage is measured on a reference capacitor charged to the second predefined voltage potential and connected to a reference cell of a known state and a capacitance.

7. The method according to claim 6, wherein said reference cell is in a state in between two states to be sensed by the method, namely a programmed state and an erased state of the memory cell.

8. The method according to claim 6, wherein charging said first capacitor comprises charging an intrinsic capacitance of bit lines and selection switches coupled to the memory cell.

9. An integrated circuit, comprising:
    a connector for a first voltage;
    a connector for a second voltage;
    an array of memory cells, each row of said array being connected to a common word line and each column of said array being connected to a common bit line, said bit line providing an associated first capacitive load;
    a plurality of sense amplifiers, each sense amplifier comprising a second capacitive load;
    each of said respective bit lines being connectable to said first voltage, such that said first capacitive load is chargeable to said first voltage;
    each of said respective second capacitive loads of said sense amplifiers being connectable to said second voltage, such that each said second capacitive load is chargeable to said second voltage; and
    each of said sense amplifiers being connectable to at least one of said bit lines, such that said second capacitive load can be discharged by a current over said bit line and a selected memory cell connected to said bit line and selected by one of said word lines, whereby said current depends on the conductivity of said selected cell and is used to determine the state of said selected cell.

10. The integrated circuit according to claim 9, wherein said first capacitive load is larger than said second capacitive load.

11. The integrated circuit according to claim 9, wherein said first voltage potential is equal to a supply voltage supplied to said integrated circuit.

12. The integrated circuit according to claim 9, further comprising a pump arrangement generating said second voltage from said first voltage.

13. The integrated circuit according to claim 9, wherein said memory cells are electrically erasable read only memory (EEPROM) cells or flash EEPROM cells.

14. The integrated circuit according to claim 13, wherein said memory cells are nitride read only memory (NROM) cells.

15. The integrated circuit according to claim 14, wherein said respective NROM cells are used to store two bits of information, a first bit, which is read by measuring a forward current through said NROM cells, and a second bit, which is read by measuring a backward current through said NROM cells.

16. The integrated circuit according to claim 12, wherein said memory cells include floating gate transistors.

17. An integrated circuit comprising:
a memory cell;
a bit line connecting the memory cell to a sense amplifier, the bit line comprising a first capacitance;
the sense amplifier including a second capacitance;
a first switch connecting the first capacitance to a first voltage potential; and
a second switch connecting the second capacitance to a second voltage potential, wherein the state of the memory cell can be determined by detecting the rate of discharge of current from the second capacitance through the first capacitance of the bit line and through the memory cell.

18. The integrated circuit of claim 17, wherein the bit line comprises a local bit line and a global bit line and further comprising a selection switch coupling the local bit line to the global bit line.

19. The integrated circuit of claim 17, further comprising a second selection switch coupling the global bit line and input of the sense amplifier.

20. The integrated circuit of claim 17, wherein the first capacitance is further comprised of intrinsic capacitance of the first and second selection switch.

* * * * *